United States Patent
Jiang et al.

(10) Patent No.: US 8,425,718 B2
(45) Date of Patent: Apr. 23, 2013

(54) WET METAL-ETCHING METHOD AND APPARATUS FOR MEMS DEVICE FABRICATION

(75) Inventors: Yadong Jiang, Chengdu (CN); Zhiming Wu, Chengdu (CN); Tao Wang, Chengdu (CN); Weizhi Li, Chengdu (CN); Xiaolin Han, Chengdu (CN)

(73) Assignee: University of Electronic Science and Technology of China, Chengdu, Sichuan Province (CN)

( * ) Notice: Subject to any disclaimer, the term of this patent is extended or adjusted under 35 U.S.C. 154(b) by 411 days.

(21) Appl. No.: 12/724,165

(22) Filed: Mar. 15, 2010

(65) Prior Publication Data

US 2011/0223771 A1    Sep. 15, 2011

(51) Int. Cl.
*H01L 21/306* (2006.01)
(52) U.S. Cl.
USPC .............................. 156/345.23; 257/E21.219

(58) Field of Classification Search ............. 156/345.11, 156/345.55, 345.23, 345.3; 257/E21.219
See application file for complete search history.

(56) References Cited

U.S. PATENT DOCUMENTS

| | | | | |
|---|---|---|---|---|
| 6,557,607 | B2* | 5/2003 | Yamada et al. | 156/389 |
| 6,681,781 | B2* | 1/2004 | Puri et al. | 134/1.3 |
| 2005/0026455 | A1* | 2/2005 | Hamada et al. | 438/782 |
| 2011/0223771 | A1* | 9/2011 | Jiang et al. | 438/747 |

* cited by examiner

*Primary Examiner* — Sylvia R. MacArthur

(57) ABSTRACT

The present invention provides a method of wet etching a silicon slice including a silicon substrate and a metal film layer thereon comprising steps of: performing lithographic process to the silicon slice forming a masked silicon slice comprising the silicon substrate and a partially masked metal film thereon; immersing the masked silicon slice into an etchant; rotating the masked silicon slice in the etchant; injecting high-purity nitrogen gas into the etchant for agitating the etchant; removing the masked silicon slice out of the etchant, upon completion of etching; and rinsing the masked silicon slice with deionized water.

20 Claims, 2 Drawing Sheets

WET METAL-ETCHING METHOD AND APPARATUS FOR MEMS DEVICE FABRICATION

BACKGROUND OF THE PRESENT INVENTION

1. Field of Invention

The present invention relates to a wet metal-etching method adapted to be used for 6 inches or above micromachining process, and more particularly to a wet metal-etching method adapted to be used for micro-machined device with high requirement of etching uniformity.

2. Description of Related Arts

With the development of the science and technology, electro-mechanic devices are becoming more and more compact, integrated and intelligent. Micro-Electro-Mechanical Systems (MEMS) is the integration of mechanical elements, sensors, actuators, and electronic circuits on a common silicon substrate through micro-fabrication technology. While the electronics are fabricated using integrated circuit (IC) process sequences (e.g., CMOS, Bipolar, or BiCMOS processes), the micromechanical components are fabricated using compatible "micromachining" processes that selectively etch away parts of the silicon wafer or add new structural layers to form the mechanical and electromechanical devices.

In order to form components on a substrate, it is necessary to selectively etch the thin films previously deposited on the substrate. Wet etching works very well for etching thin films on substrates, and can also be used to etch the substrate itself. The problem with wet etching is that its isotropic character will cause overetch of the thin film under the mask layer. The overetch, even less than 1 μm, is unacceptable for the ULSI, because it will results in a loss of space. Therefore, dry etching with anisotropic character is commonly adopted by the semiconductor manufacturer. In most cases, however, space is not so critical for MEMS devices because of its low integrity, and, in addition, dry etching is much more expensive compared to wet etching. Furthermore, many materials used in MEMS, especially metal material, such as NiCr, Au, Cu and so on, are not compatible with the semiconductor process, and can not be etched by dry etching process. In comparison, almost all metal materials can be etched via wet etching process and all kinds of metal etchants are already available in the market.

However, the overetch, especially non-uniform overetch is still a serious problem in the wet metal-etching process, especially for large diameter silicon wafer, such as 6 inches (and above) wafer. Therefore, an improved wet metal-etching process that ensures a uniform etch over whole wafer is highly desirable.

SUMMARY OF THE PRESENT INVENTION

An object of the present invention is to provide a wet metal-etching method for use in MEMS to avoid obvious overetch and improve etching uniformity during a wet etching process.

Another object of the present invention is to provide a wet etching apparatus to perform the wet metal-etching process.

Accordingly, in order to accomplish the above objects, the present invention provides a method of wet etching a silicon slice including a silicon substrate and a metal film layer thereon comprising steps of:

(a) performing lithographic process to the silicon slice to form a masked silicon slice comprising the silicon substrate and a masked metal film thereon;

(b) immersing the masked silicon slice into an etchant;

(c) injecting nitrogen gas into the etchant for agitating the etchant;

(d) rotating the masked silicon slice in the etchant forming an etched silicon slice;

(e) removing the etched silicon slice out of the etchant upon completion of etching; and (f) rinsing the etched silicon slice with deionized water.

The present invention also provides a wet etching apparatus comprising a silicon slice holder for holding a masked silicon slice, a motor connected with the silicon slice holder for rotating the masked silicon slice via the silicon slice holder at a constant speed, an etchant vessel having etchant therein for receiving the masked silicon slice therein, a supporting frame connected to the silicon slice holder for supporting the silicon slice holder, a vessel supporter placed under the etchant vessel for supporting the etchant vessel, and high-purity nitrogen gas cylinder injecting high-purity nitrogen gas into the etchant vessel for agitating the etchant in the etchant vessel.

These and other objectives, features, and advantages of the present invention will become apparent from the following detailed description, the accompanying drawings, and the appended claims.

DETAILED DESCRIPTION OF THE PREFERRED EMBODIMENT

Figure 1:
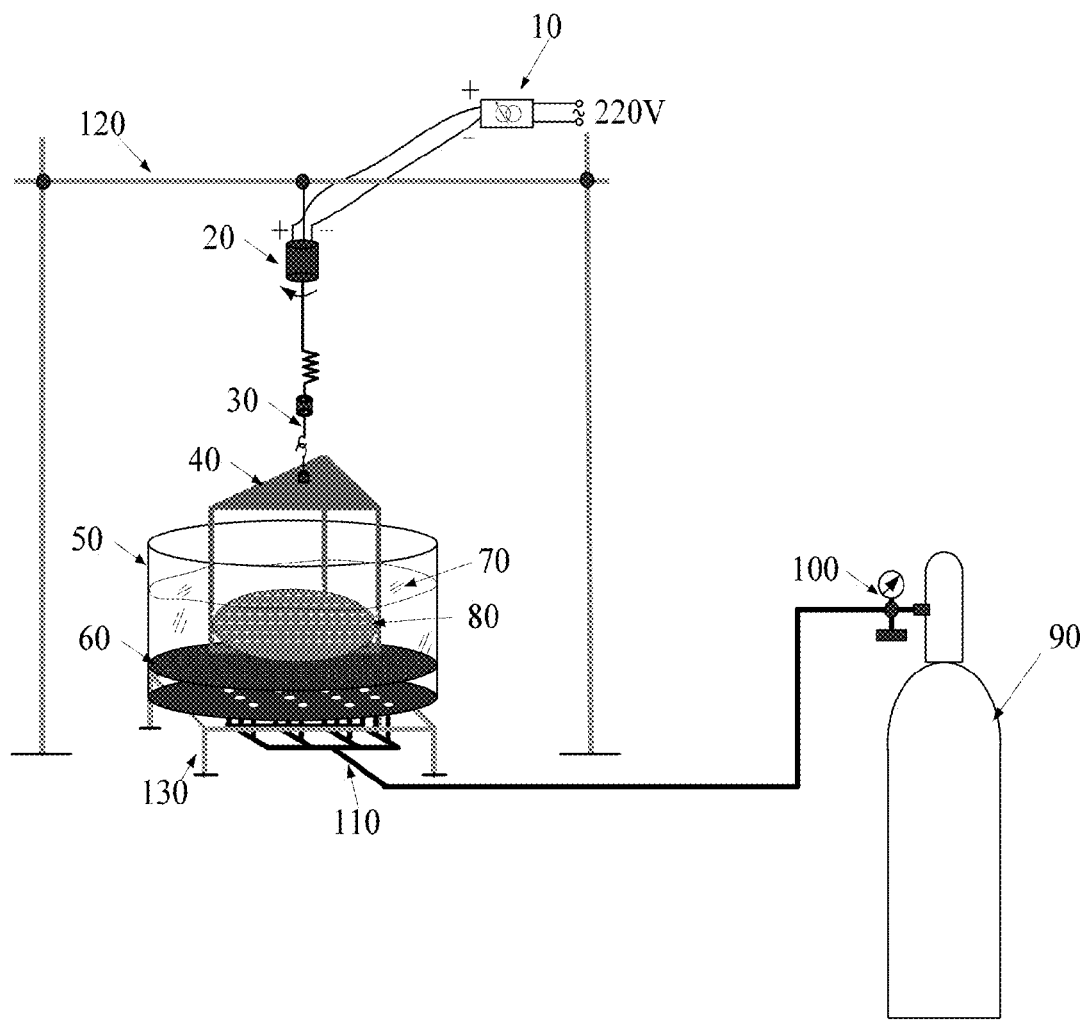
FIG. 1 is an illustrative view of a wet etching apparatus according to a preferred embodiment of the present invention.

The present invention provides a method of wet etching a silicon slice including a silicon substrate 81 and a metal film layer 82 thereon comprising steps of: (a) performing lithographic process to the silicon slice forming a masked silicon slice 80 comprising the silicon substrate 81 and a partially masked metal film 82 thereon; (b) immersing the masked silicon slice 80 into an etchant 70; (c) injecting inert gas, preferably high purity nitrogen gas, into the etchant for agitating the etchant; (d) rotating the masked silicon slice 80 in the etchant 70 forming an etched silicon slice; (e) removing the etched silicon slice 80 out of the etchant 70, upon completion of etching; and (f) rinsing the etched silicon slice 80 with deionized water.

Step (a) comprises a step of applying a photoresist 83 onto the metal film layer 82 of the silicon slice. In step (b), the masked silicon slice 80 is horizontally or proximately horizontally immersed into the etchant. In step (c), adjust the pressure of nitrogen gas in order to agitate the etchant softly. In step (d), rotate the silicon slice 80 slowly at a constant speed in the etchant. Step (f) comprises steps of immersing the etched silicon slice 80 into deionized water and spraying the deionized water to the etched silicon slice 80 at the same time.

After step (f), the method of wet etching a silicon slice including a silicon substrate 81 and a metal film layer 82 thereon further comprises step of: (g) detecting resistance of etched metal film and observing surface of the etched silicon 80 via a microscope, (h) if a resistance is detected or there is a residue or pollution observed on the surface of the etched silicon slice 80, repeating steps (b) to (f). If resistance is not detected and there is not residue or pollution on the surface of the masked silicon slice 80, the etching is completed. Record time from step (b) until the etching is completed. The completion of the etching in step (e) can be determined according to the above-mentioned time record.

The method of wet etching a silicon slice including a silicon substrate 81 and a metal film layer 82 thereon further comprises step of: (i) drying the etched silicon slice 80 by blowing nitrogen gas to the silicon substrate; (j) removing the photoresist 83 on the metal film layer 82; and (k) rinsing and drying the etched silicon slice. After step (k), observe the overetch width and etching uniformity via a microscope and record these parameters.

Referring to FIG. 1 of the drawings, a wet etching apparatus according to a preferred embodiment of the present invention is illustrated, in which the wet etching apparatus comprises a silicon slice holder 40 for holding a masked silicon slice 80, a motor 10 connected with the silicon slice holder 40 for rotating the masked silicon slice 80 via the silicon slice holder 40 at a constant speed, an etchant vessel 50 having etchant 70 therein for receiving the masked silicon slice 80 therein, a supporting frame 120 connected to the silicon slice holder for supporting the silicon slice holder 40, a vessel supporter 130 placed under the etchant vessel for supporting the etchant vessel 50, and an inert gas cylinder, such as high-purity nitrogen cylinder, 90 injecting inert gas, such as nitrogen gas to the etchant vessel 50 for agitating the etchant 70 in the etchant vessel 50.

Figure 2:
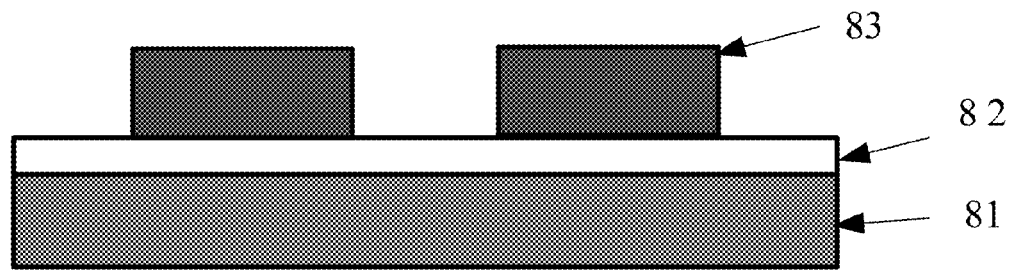
FIG. 2 is an illustrative view of a masked silicon slice according to the above preferred embodiment of the present invention.
Figure 3:
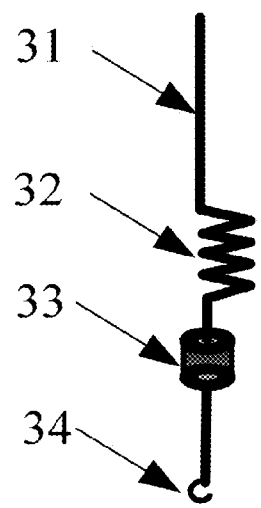
FIG. 3 is a perspective view of a connector of the wet etching apparatus according to the above preferred embodiment of the present invention.

The wet etching apparatus is for etching a masked silicon slice 80 including a silicon substrate 81, a thin metal film 82 deposited on the silicon substrate, and a mask 83 partially covering on the thin metal film 82 as shown in FIG. 2. The metal film is selected from the group consisting of Ni, Cr, NiCr, Au, Ag, Cu, Ti, Al, W, Mo, Pt, which are often used in MEMS process. In this preferred embodiment, the mask 83 is photoresist partially applied onto the thin metal film 82. The masked silicon slice 80 is horizontally or proximately horizontally placed onto the silicon slice holder 40, and can be moved to a suitable position via the silicon slice holder 40.

The wet etching apparatus further comprises a pipe 110 connected between the high-purity nitrogen cylinder 90 and bottom of the etchant vessel 50. The nitrogen is injected into the etchant vessel 50 from outlets of the pipe 110 that are evenly distributed at bottom thereof for agitating the etchant softly. The high-purity nitrogen cylinder 90 comprises a pressure regulating valve 100 for adjusting the nitrogen pressure entering into the etchant vessel 50 for agitating the etchant 70 in the etchant vessel 50 softly.

The wet etching apparatus further comprises a shower head 60 provided in the etchant vessel 50 above the outlets of the pipe 110 for evenly agitating the etchant.

The wet etching apparatus further comprises a connector 30, wherein the silicon slice holder 40 are connected with the motor 10 via the connector 30. The connector 30 comprises a straight pole 31, a spring 32, a bearing 33 and a hook connected one after another, wherein the straight pole 31 is connected with the motor 10, and the hook is connected to the silicon slice holder 40. When the spring 32 is not stretched, the masked silicon slice 80 is above the etchant 70, and when the spring 32 is stretched, the masked silicon slice 80 is completely immersed into the etchant 70 without touching the etchant vessel 50, so that the silicon slice holder 40 can rotate freely in the etchant vessel 50.

The motor 10 further comprises a speed controller 20 for controlling the rotating speed of the masked silicon slice 80 via the silicon slice holder 40. The silicon slice holder 40 and the etchant vessel 50 are made of polytetrafluoroethylene that will not react with the etchant.

The etching process is illustrated hereinafter. Hold the bearing 33 of the connector 30 and immerse the masked silicon slice into the etchant 70. Observe the surface of the masked silicon slice and detecting the resistance of the metal film of the masked silicon slice. Recording the time needed to complete the etching process. Hold the bearing 33 of the connector 30 and take the masked silicon slice out of the etchant 70, and then detach the silicon slice holder with the masked silicon slice from the hook 34 of the connector and rinse them in sink with deionized water.

In this preferred embodiment, the metal film is NiCr, and the etchant comprises ceric ammonium nitrate, deionized water, acetic acid, wherein ceric ammonium nitrate:deionized water:acetic acid=4 g:20 ml:1 ml.

An experiment shows a good result of the present invention, wherein overetch $\leqq 0.5$ μm and uniformity $\leqq 5\%$.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A wet etching apparatus, comprising:
a silicon slice holder for horizontally holding a masked silicon slice,
a motor for rotating the masked silicon slice at a constant speed,
an etchant vessel having etchant therein for receiving the masked silicon slice therein,
a connector connecting the silicon slice holder with the motor, wherein the connector comprises a straight pole, a spring, a bearing and a hook connected one after another, wherein the straight pole is connected with the motor, and the hook is connected with the silicon holder, wherein when the spring is fully relaxed, the silicon slice holder is above the etchant, and when the spring is stretched, the masked silicon slice is completely immersed into the etchant without the silicon slice holder touching the etchant vessel, so as to freely rotate the silicon slice holder in the etchant vessel;
a supporting frame connected with the motor for supporting the motor and the silicon slice holder, and
an inert gas cylinder injecting inert gas to the etchant vessel for agitating the etchant in the etchant vessel.

2. The wet etching apparatus, as recited in claim 1, wherein the inert gas cylinder is nitrogen gas cylinder and the inert gas is nitrogen gas.

3. The wet etching apparatus, as recited in claim 2, further comprising a pipe communicated the nitrogen gas cylinder with a bottom of the etchant vessel, so that the nitrogen gas is injected into the etchant vessel from outlets of the pipe that are evenly distributed at the bottom of the etchant vessel for softly agitating the etchant.

4. The wet etching apparatus, as recited in claim 3, wherein the nitrogen gas cylinder comprises a pressure regulating valve for adjusting a nitrogen gas pressure entering into the etchant vessel to softly agitate the etchant in the etchant vessel.

5. The wet etching apparatus, as recited in claim 4, further comprising a shower head provided in the etchant vessel above the pipe for evenly agitating the etchant in the etchant vessel.

6. The wet etching apparatus, as recited in claim 5, wherein the motor comprises a speed controller for controlling the rotating speed of the masked silicon slice.

7. The wet etching apparatus, as recited in claim 6, wherein the silicon slice holder and the etchant vessel are made of polytetrafluoroethylene.

8. The wet etching apparatus, as recited in claim 7, further comprising a vessel supporter placed under the etchant vessel for supporting the etchant vessel.

9. The wet etching apparatus, as recited in claim 8, wherein the masked silicon slice including a silicon substrate, a thin metal film deposited on the silicon substrate, and a mask partially covering on the thin metal film, wherein the metal film is selected from the group consisting of Ni, Cr, NiCr, Au, Ag, Cu, Ti, Al, W, Mo and Pt.

10. The wet etching apparatus, as recited in claim 9, wherein the metal film is NiCr, and the etchant contains ceric ammonium nitrate, deionized water, and acetic acid.

11. The wet etching apparatus, as recited in claim 10, wherein ceric ammonium nitrate: deionized water: acetic acid=4 g:20 ml:1 ml.

12. The wet etching apparatus, as recited in claim 3, further comprising a shower head provided in the etchant vessel above the pipe for evenly agitating the etchant in the etchant vessel.

13. The wet etching apparatus, as recited in claim 2, wherein the nitrogen gas cylinder comprises a pressure regulating valve for adjusting a nitrogen gas pressure entering into the etchant vessel to softly agitate the etchant in the etchant vessel.

14. The wet etching apparatus, as recited in claim 1, further comprising a pipe communicated the inert gas cylinder with a bottom of the etchant vessel, so that the inert gas is injected into the etchant vessel from outlets of the pipe that are evenly distributed at the bottom of the etchant vessel for softly agitating the etchant.

15. The wet etching apparatus, as recited in claim 14, wherein the inert gas cylinder comprises a pressure regulating valve for adjusting an inert gas pressure entering into the etchant vessel to softly agitate the etchant in the etchant vessel.

16. The wet etching apparatus, as recited in claim 15, further comprising a shower head provided in the etchant vessel above the pipe for evenly agitating the etchant in the etchant vessel.

17. The wet etching apparatus, as recited in claim 16, wherein the motor comprises a speed controller for controlling the rotating speed of the masked silicon slice.

18. The wet etching apparatus, as recited in claim 17, wherein the silicon slice hoder and the etchant vessel are made of polytetrafluoroethylene.

19. The wet etching apparatus, as recited in claim 14, further comprising a shower head provided in the etchant vessel above the pipe for evenly agitating the etchant in the etchant vessel.

20. The wet etching apparatus, as recited in claim 1, wherein the inert gas cylinder cimprises a pressure regulating valve for adjusting an inert gas pressure entering into the etchant vessel to softly agitate the etchant in the etchant vessel.

* * * * *